(12) United States Patent
Pahuja

(10) Patent No.: US 10,177,729 B1
(45) Date of Patent: Jan. 8, 2019

(54) AUTO LEVEL IN DIGITAL RADIO SYSTEMS

(71) Applicant: Ibiquity Digital Corporation, Columbia, MD (US)

(72) Inventor: Ashwini Pahuja, Roslyn Heights, NY (US)

(73) Assignee: Ibiquity Digital Corporation, Columbia, MD (US)

( * ) Notice: Subject to any disclaimer, the term of this patent is extended or adjusted under 35 U.S.C. 154(b) by 0 days.

(21) Appl. No.: 15/899,135

(22) Filed: Feb. 19, 2018

(51) Int. Cl.
*H04R 3/00* (2006.01)
*H03G 3/00* (2006.01)
*H03G 3/30* (2006.01)
*H03G 3/34* (2006.01)
*H04N 5/60* (2006.01)

(52) U.S. Cl.
CPC ......... *H03G 3/3026* (2013.01); *H03G 3/3089* (2013.01); *H03G 3/344* (2013.01); *H04N 5/602* (2013.01)

(58) Field of Classification Search
CPC ........ H04R 3/00; H04R 3/12; H04R 2430/00; H04R 2430/01; H04R 2203/00; H03G 3/00; H03G 3/001; H03G 3/002; H03G 3/3005; H03G 3/3026; H03G 3/3089; H03G 3/32; H03G 7/007; H03G 5/165; H03H 3/344; H04N 5/602
See application file for complete search history.

(56) References Cited

U.S. PATENT DOCUMENTS

| | | |
|---|---|---|
| 6,178,317 B1 | 1/2001 | Kroeger et al. |
| 6,473,604 B1 | 10/2002 | Hinkle et al. |
| 6,590,944 B1 | 7/2003 | Kroeger |
| 6,735,257 B2 | 5/2004 | Kroeger |
| 6,901,242 B2 | 5/2005 | Kroeger et al. |
| 7,039,204 B2 | 5/2006 | Baumgarte |

(Continued)

FOREIGN PATENT DOCUMENTS

WO   WO-2017100528 A1   6/2017

OTHER PUBLICATIONS

"Algorithms to measure audio programme loudness and true-peak audio level", Recommendation ITU-R BS.1770-3, (2012), 1-22.

(Continued)

*Primary Examiner* — Thang V Tran
(74) *Attorney, Agent, or Firm* — Schwegman Lundberg & Woessner, P.A.

(57) ABSTRACT

Systems and methods to process a digital audio broadcast signal having a plurality of digital audio signals can be implemented in a variety of applications. The digital audio broadcast signal having a main program service and a set of supplemental program services can be received at a digital audio system and processed to provide an audio signal to a set of speakers. The processing can include calculation of audio levels of audio signals of the main program service and the supplemental program services. One of the services can be selected with the audio signal of the selected service adjusted based on the calculated level of the selected service and a reference signal, prior to sending the audio signal to the set of speakers. In various embodiments, the reference signal can be an analog audio signal in the digital audio broadcast signal. Additional apparatus, systems, and methods are disclosed.

20 Claims, 6 Drawing Sheets

(56) References Cited

U.S. PATENT DOCUMENTS

| | | | |
|---|---|---|---|
| 7,546,088 B2 | 6/2009 | Kroeger et al. | |
| 7,715,566 B2 | 5/2010 | Seo | |
| 7,944,998 B2 | 5/2011 | Shridhar et al. | |
| 7,953,183 B2 | 5/2011 | Shridhar et al. | |
| 8,014,446 B2* | 9/2011 | Shah | H04H 60/27 348/389.1 |
| 8,027,419 B2 | 9/2011 | Iannuzzelli et al. | |
| 8,040,989 B2 | 10/2011 | Nekhamkin et al. | |
| 8,165,548 B2 | 4/2012 | Kon et al. | |
| 8,180,470 B2 | 5/2012 | Pahuja | |
| 8,290,423 B2 | 10/2012 | Wang et al. | |
| 8,520,852 B2 | 8/2013 | Shah et al. | |
| 8,576,949 B2 | 11/2013 | Shah et al. | |
| 8,615,095 B2 | 12/2013 | Chen | |
| 8,804,865 B2 | 8/2014 | Elenes et al. | |
| 8,976,969 B2 | 3/2015 | Elenes et al. | |
| 9,025,773 B2 | 5/2015 | Whitecar et al. | |
| 9,300,413 B2 | 3/2016 | Jaisimha et al. | |
| 9,407,383 B2 | 8/2016 | Milbar et al. | |
| 9,413,322 B2 | 8/2016 | Soulodre et al. | |
| 9,559,657 B2 | 1/2017 | Jaisimha et al. | |
| 9,584,347 B2 | 2/2017 | Elenes | |
| 9,755,598 B2 | 9/2017 | Olochwoszcz | |
| 9,947,332 B2 | 4/2018 | Olochwoszcz et al. | |
| 2006/0019601 A1 | 1/2006 | Kroeger et al. | |
| 2006/0227814 A1 | 10/2006 | Iannuzzelli et al. | |
| 2006/0229750 A1* | 10/2006 | Rozier | H04H 20/28 700/94 |
| 2007/0177743 A1* | 8/2007 | Mertens | H04N 5/607 381/107 |
| 2007/0291876 A1 | 12/2007 | Shridhar et al. | |
| 2007/0293167 A1 | 12/2007 | Shridhar et al. | |
| 2009/0070597 A1* | 3/2009 | Shah | H04H 20/31 700/94 |
| 2011/0110464 A1 | 5/2011 | Watanabe | |
| 2012/0028567 A1 | 2/2012 | Marko | |
| 2013/0003637 A1 | 1/2013 | Elenes et al. | |
| 2013/0003894 A1 | 1/2013 | Elenes et al. | |
| 2013/0003904 A1 | 1/2013 | Elenes et al. | |
| 2013/0247100 A1* | 9/2013 | Quan | H04N 5/44513 725/39 |
| 2013/0259264 A1* | 10/2013 | Okuhara | H03G 1/00 381/104 |
| 2013/0343547 A1 | 12/2013 | Pahuja et al. | |
| 2014/0140537 A1 | 5/2014 | Soulodre | |
| 2016/0241350 A1 | 8/2016 | Nekhamkin et al. | |
| 2017/0169832 A1 | 6/2017 | Olochwoszcz et al. | |
| 2017/0179899 A1 | 6/2017 | Olochwoszcz et al. | |

OTHER PUBLICATIONS

"U.S. Appl. No. 14/966,716, Non Final Office Action dated Sep. 8, 2017", 8 pgs.

"U.S. Appl. No. 14/966,716, Response filed Nov. 9, 2017 to Non Final Office Action mailed Sep. 8, 2017", 9 pgs.

"U.S. Appl. No. 14/974,809, Non Final Office Action dated Feb. 7, 2017", 10 pgs.

"U.S. Appl. No. 14/974,809, Response filed Apr. 19, 2017 to Non Final Office Action dated Feb. 7, 2017", 7 pgs.

"In-Band/On-Channel Digital Radio Broadcasting Standard", NRSC-5-C, National Radio Systems Committee, Washington, DC,, (Sep. 2011), 6 pgs.

"International Application Serial No. PCT/US2016/065754, International Search Report dated Mar. 10, 2017", 4 pgs.

"International Application Serial No. PCT/US2016/065754, Written Opinion dated Mar. 10, 2017", 10 pgs.

Soulodre, Gilbert A, et al., "Development and Evaluation of Short-Term Loudness Meters", Audio Engineering Society Convention Paper 6889, Presented at the 121st Convention, San Francisco, California, (Oct. 5-8, 2006), 1-10.

Soulodre, Gilbert A, "Evaluation of Objective Loudness Meters", Audio Engineering Society Convention Paper 6161, Presented at the 116th Convention, Berlin, Germany,, (May 8-11, 2004), 1-12.

"International Application Serial No. PCT US2016 065754, International Preliminary Report on Patentability dated Jun. 21, 2018", 10 pgs.

"U.S. Appl. No. 15/926,536, Non Final Office Action dated Aug. 9, 2018", 10 pgs.

\* cited by examiner

AUTO LEVEL IN DIGITAL RADIO SYSTEMS

FIELD OF THE INVENTION

The present invention relates generally to apparatus and methods of processing of audio signals.

BACKGROUND

Digital radio broadcasting technology delivers digital audio and data services to mobile, portable, and fixed receivers. One type of digital radio broadcasting, referred to as in-band on-channel (IBOC) digital audio broadcasting (DAB), uses terrestrial transmitters in the existing Medium Frequency (MF) and Very High Frequency (VHF) radio bands. HD Radio™ technology, developed by iBiquity Digital Corporation, is one example of an IBOC implementation for digital radio broadcasting and reception.

IBOC technology can provide digital quality audio, superior to existing analog broadcasting formats. Because each IBOC signal is transmitted within the spectral mask of an existing AM or FM channel allocation, it requires no new spectral allocations. IBOC promotes economy of spectrum while enabling broadcasters to supply digital quality audio to the present base of listeners.

The National Radio Systems Committee, a standard-setting organization sponsored by the National Association of Broadcasters and the Consumer Electronics Association, adopted an IBOC standard, designated NRSC-5, in September 2005. NRSC-5, the disclosure of which is incorporated herein by reference, sets forth the requirements for broadcasting digital audio and ancillary data over AM and FM broadcast channels. The standard and its reference documents contain detailed explanations of the RF/transmission subsystem and the transport and service multiplex subsystems. Copies of the standard can be obtained from the NRSC at http://www.nrscstandards.org/standards.asp. IBiquity's HD Radio™ technology is an implementation of the NRSC-5 IBOC standard. Further information regarding HD Radio™ technology can be found at www.hdradio.com and www.ibiquity.com.

IBOC signals can be transmitted in a hybrid format including an analog modulated carrier in combination with a plurality of digitally modulated carriers or in an all-digital format wherein the analog modulated carrier is not used. Using the hybrid mode, broadcasters may continue to transmit analog AM and FM simultaneously with higher-quality and more robust digital signals, allowing themselves and their listeners to convert from analog-to-digital radio while maintaining their current frequency allocations.

Both AM and FM IBOC hybrid broadcasting systems utilize a composite signal including an analog modulated carrier and a plurality of digitally modulated subcarriers. Program content (e.g., audio) can be redundantly transmitted on the analog modulated carrier and the digitally modulated subcarriers. The analog audio is delayed at the transmitter by a diversity delay. Herein, audio may also be referred to as audio content or audio signal. The phrases "audio", "audio content", and "audio signal" with respect to input to a device is a signal that is representative of a physical sound. Physical sound output from a device such as a speaker can be referred to as an acoustic signal.

In the absence of the digital audio signal, for example, when the channel is initially tuned, the analog AM or FM backup audio signal is fed to the audio output. When the digital audio signal becomes available, a blend function smoothly attenuates and eventually replaces the analog backup signal with the digital audio signal, while blending in the digital audio signal such that the transition preserves some continuity of the audio program. Similar blending occurs during channel outages which corrupt the digital signal. In this case, the analog signal is gradually blended into the output audio signal by attenuating the digital signal such that the audio is fully blended to analog when the digital corruption appears at the audio output. Corruption of the digital audio signal can be detected during the diversity delay time through cyclic redundancy check (CRC) error detection means, or other digital detection means in the audio decoder or receiver.

Blending between the digital audio signal of an IBOC system and the analog audio signal has been previously described in, for example, U.S. Pat. Nos. 7,546,088; 6,178,317; 6,590,944; 6,735,257, 6,901,242; and 8,180,470, which are hereby incorporated by reference in their entireties. As can be seen from above, a blend is a transition from a digital signal to analog signal or vice versa. The number of blends is a count of transitions of an audio signal from digital audio to analog audio. Fewer blends will lead to a better user experience. The diversity delay and blend allow the receiver to fill in the digital audio gaps with analog audio when digital outages occur. The diversity delay ensures that the audio output has a reasonable quality when brief outages occur in a mobile environment (for example, when a mobile receiver passes under a bridge). This is because the time diversity causes the outages to affect different segments of the audio program for the digital and analog signals.

In the receiver, the analog and digital pathways may be separately processed, and thus asynchronously processed. In a software implementation, for example, analog and digital demodulation processes may be treated as separate tasks using different software threads. Subsequent blending of the analog and digital signals requires that the signals be aligned in time before they are blended.

Both FM and AM Hybrid IBOC receivers may require an audio blend function for the purposes of blending to the FM or AM analog backup signal when the digital signal is unavailable. The maximum blend transition time is limited by the diversity delay and receiver decoding times, and is typically less than one second. Frequent blends can sometimes degrade the listening experience when the audio differences between the digital and analog are significant.

Typically, blending is a part of an IBOC system, where blends are not eliminated. All digital broadcast systems have an edge of coverage. This is much more noticeable than an analog system, since a digital system has a small transition region where the audio quality will degrade, based on blend thresholds, but will be more abrupt than an analog signal. Bad blending may be a major complaint of an IBOC system, as it leads to customer dissatisfaction and listener fatigue.

As noted above, blending will typically occur at the edge of digital coverage. In addition, blending will typically occur at other locations within the coverage contour where the digital waveform is corrupted. When a short outage does occur, such as traveling under a bridge, the loss of digital audio is replaced by an analog signal. When blending occurs, it is important that the content on the analog audio and digital audio channels are aligned in both time and level (i.e., loudness) to ensure that the transition is barely noticed by the listener. Optimally, the listener will notice little other than possible inherent quality differences in analog and digital audio at these blend points. However, if the broadcast station does not have the analog and digital audio signals aligned, then the result could be a harsh sounding transition between digital and analog audio. The misalignment may occur because of audio processing differences between the analog audio and digital audio paths at the broadcast facility. Furthermore, the analog and digital signals are typically generated with two separate signal generation paths before combining for output. The use of different analog processing techniques and different signal generation methods makes the alignment of these two signals nontrivial.

DETAILED DESCRIPTION

Figure 1:
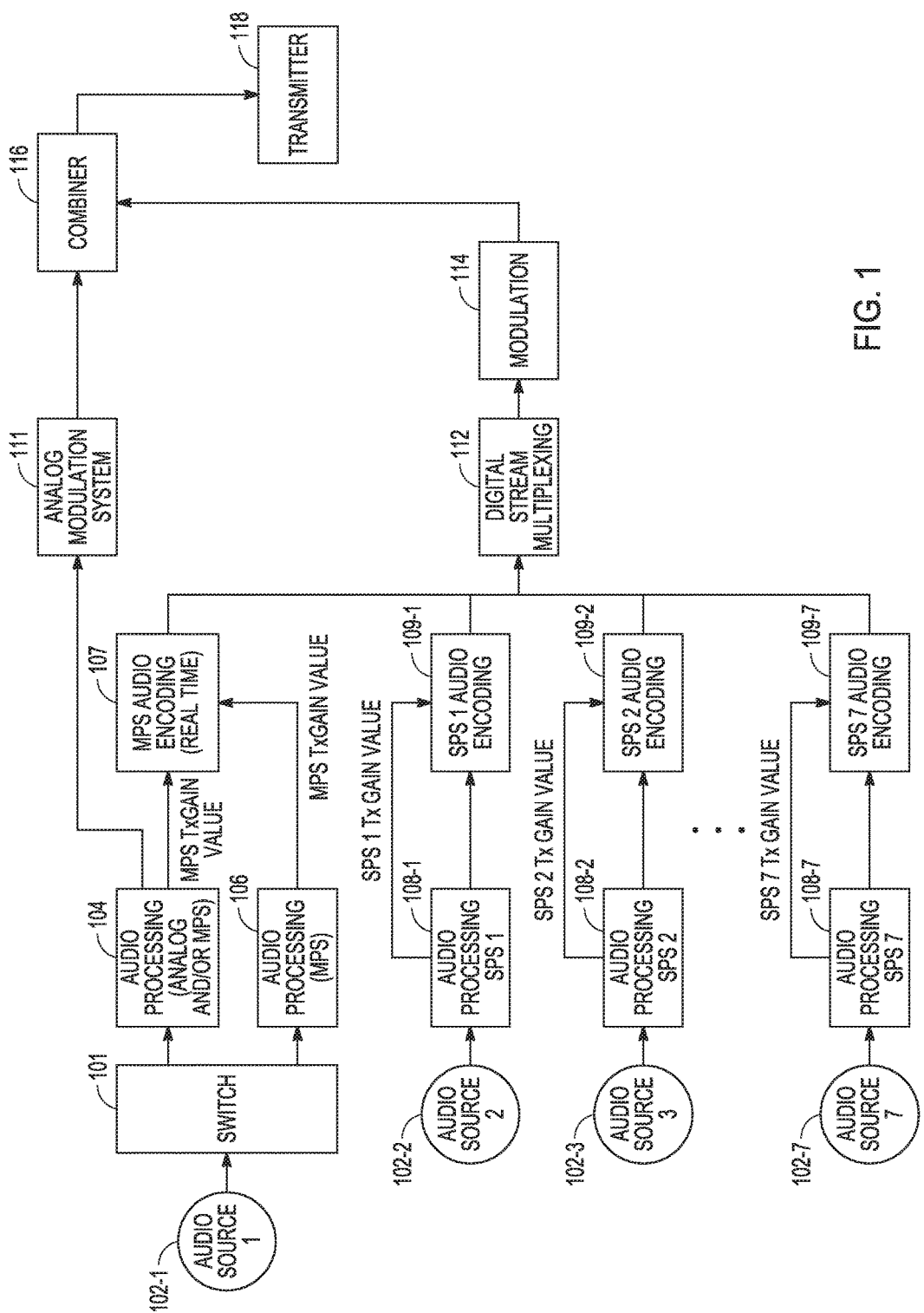
FIG. 1 is an example of a transmit side of a digital radio system, in accordance with various embodiments.

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Blending should be smooth and continuous, which can happen only if the analog and digital audio are aligned in both time and level. In a digital audio system such as a HD Radio™ system, analog audio can come from the tuner or from on chip demodulation. Regardless of the source, the analog audio and digital audio can have different levels. To align the levels, the levels can be statically aligned, which is used as a starting point, with an automatic audio alignment (AAA) algorithm. Features of an example of an AAA algorithm for a digital signal and an analogy signal are provided in U.S. patent application Ser. No. 14/966,716 filed 11 Dec. 2015, which is incorporated by reference in its entirety, and U.S. Pat. No. 9,755,598 filed 18 Dec. 2015, which is incorporated by reference in its entirety. Such an AAA algorithm can align the level as well as provide time alignment between an analog and a digital steam. Since analog operations can be performed on chip, currently the adjustment may be performed only on the digital stream, since analog comes before digital and, after the fact, the time alignment cannot be applied to the analog, since that will result in discontinuous audio. In addition, analog may be coming from another device/chip and may not allow the desired operation. It is to be noted that AAA will only work if the mode of transmission in hybrid, i.e., analog and digital streams have the same content and blending between the two is allowed.

Since blending is a part of an IBOC system, consider time, level, and phase alignment at blend points. With respect to time alignment, analog and digital signals should be time aligned so that the user does not hear distortions during blend cross fades. Gross misalignment will cause a repeat of audio, which is an echo, while minor misalignment will cause stuttering of audio. With respect to level alignment, analog and digital signals should be level aligned, so that there is no perceived volume difference, else there will be listener fatigue, as one signal will sound louder than other. With respect to phase alignment, phase of the analog and the digital signal should be the same; else there will be a dip in volume due to cancellation.

Blending can have different attributes with respect to main program service (MPS) in a main channel and supplemental program services (SPS) in other channels. The MPS in a standard IBOC system can be viewed as a direct extension of traditional analog radio. MPS can have two components: audio content, which can be referred to as audio (MPSA) and data (MPSD). MPSD can include such information as title, artist, album, genre, comments, commercial identifiers, reference identifiers, and other data. The MPS audio can be carried on both the analog component and the digital component of the IBOC signal. IBOC receivers typically refer to the channel for MPS as HD-1. A conventional IBOC system enables the transmission of existing analog radio programming in both analog and digital formats. This may allow for a smooth transition from analog to digital radio. Radio receivers that are not IBOC digital radio-enabled can continue to receive the traditional analog radio signal, while IBOC digital radio-enabled receivers can receive both digital and analog signals via the same frequency band, in the same FCC-allocated channel. Typical IBOC receivers can have the ability to blend from the MPS digital audio to the analog audio signal when the received signal quality is not sufficient for digital audio reception or when digital packets in the MPS Protocol Data Unit (PDU) are corrupted.

The SPS (supplemental program service, also referred to as HD2/3/../7) in a standard IBOC system can be viewed as a direct extension of MPS in FM band IBOC digital radio broadcasting transmissions. SPS can have two components: audio content, which can be referred to as audio, (SPSA) and data (SPSD). SPSD can include such information as title, artist, album, genre, comments, commercial identifiers, reference identifiers, and other data. Though MPS audio has backup in the analog audio, typically, there is not an analog backup of the SPS. Since there is no analog backup of the SPS audio, conventional IBOC receivers cannot blend to analog for SPS channels, and will mute when the received signal quality is not sufficient for digital audio reception or when digital packets in the SPS PDU are corrupted.

SPS can support transmission of additional audio channels, in addition to the MPS, in digital format, as well as encrypted audio. This capability allows for additional audio programs to be broadcast on the same RF carrier, often referred to as "multicasting" or "multicast channels." Multiple SPS channels or programs may be transmitted simultaneously, for example, but not limited to, seven channels. For conventional IBOC receivers, channels for SPS are typically referred to as HD-2, HD-3, etc up to one more than the maximum number of SPS of the receiver. An IBOC system allows broadcasters to reallocate capacity that could otherwise be used for MPS or advanced data services in order to allow for this SPS configuration. A station's broadcast of SPS typically will not affect a receiver's ability to receive traditional analog radio signals or MPS transmissions, even if the receiver is not SPS-enabled. The SPS transport can be identical to the MPS transport, where both services contain identical header and data structures.

With respect to main channel MPS, blends are between the analog and the MPS stream. Good user experience occurs when the MPS stream and the analog stream are aligned. Most current receivers are aligned statically in the factory. Level can be set via factory, but updated over the air (OTA) in the channel. Different implementations at the transmitter side can lead to misalignments which can vary in size, for example, greater than three samples being misaligned by one minute in time and varying in level and phase differences. Bad baseband crystal can lead to time misalignment. Changes to the tuner settings can lead to time/level/phase misalignment. In a number of designs, an AAA feature, with respect to time/phase/level, has been introduced to assist in the MPS channel. Application of the AAA feature can override OTA and factory settings and provide the same level as the analog channel.

With respect to SPSs in a conventional IBOC system, there is no analog back up and blends converge to silence. Audio level is dependent on static receiver setting and user controlled volume, and audio level on an SPS is independent of MPS channel and analog channel. Differences in audio level between SPS and MPS/Analog can lead to listener fatigue and poor user experience.

The AAA algorithm can work on time and level aligning the MPS stream of an IBOC system when in hybrid mode of transmission, or a digital radio system having some of the characteristics of an IBOC system, with the analog stream. The level alignment found on the MPS can be out of sync with the other channels (SPS channels) on the same frequency. Once a user tunes from an MPS stream of channel HD-1 to secondary streams SPS 1, SPS 2 . . . of channels HD-1, HD-2 . . . , respectively, there can be a perceived loudness difference, which can be very noticeable and can lead to user irritation as the user has to adjust the volume level again. This process may be repeated when the user switches to another SPS or back to the original MPS. The difference in loudness can lead to saturation of the data and the audio can sound muffled. In addition, the loudness component could vary from frequency to frequency, and hence lead to listener fatigue with the digital radio system being used.

There are potential level differences between MPS/analog and an SPS. When a user switches from MPS/analog stream to a SPS, there can be perceptual level differences, which may cause the user to adjust levels after a switch to the SPS. When the user switches from a SPS to the MPS/analog, the user most likely will switch the volume again after a switch to MPS/analog. SPS perceptual level is independent compared to the MPS/analog and may be currently set in conventional IBOC systems statically at the factory. In addition, SPS can be controlled at the transmit (Tx) site. MPS and SPS are set independently as they can operate from different locations and independent audio processing. With respect to difference in loudness due to user volume control, Tx site settings as well factory settings in the receiver can lead to saturation of data or muffled audio. This can vary from receiver to receiver.

To address such potential level differences, the switch from MPS to a SPS or direct tune to SPS should be sufficiently fast to meet timing specifications and accurate. With respect to HD-X auto level control in the receiver, X referring to channel number, such control can be implemented in a host processor. However, implementation in the host control will be slow and after the fact, that is, the user is already listening to the audio and then the gain is being adjusted. This will lead to a ramp up/ramp down effect and not the best user experience. The gain, which is sent OTA, is applied to the audio, which could lead to saturation initially prior to the adjustment.

In various embodiments, auto level control of digital channels of a digital audio system can be implemented in the baseband, which may be implemented using software for the digital audio system. The digital audio system may include a receiver that receives a digital radio broadcast signal. In various embodiments, a digital radio broadcast signal can include a MPS and a set of SPSs, where the set has one or more SPSs, with MPS and SPS defined similar to MPS and SPS in an IBOC system. A digital radio broadcast signal may have a format including an analog modulated carrier in combination with a plurality of digitally modulated carriers or in an all-digital format wherein the analog modulated carrier is not used. A digital audio system, using an AAA algorithm for MPS and related analog signal, can have a priori knowledge of the analog perceptual level, due to application of the AAA process. That knowledge can be used and a corresponding value can be fed for a selected SPS. A level alignment algorithm can be used to calculate the perceptual level of the SPS, and then adjust the SPS level prior to the output at a digital to analog converter (DAC) preceding a speaker. Measurement of perceptual levels may be conducted with procedures in accordance to the International Telecommunication Union's Radiocommunication Sector (ITU-R).

The same process can be followed to direct tune to SPS, where the SPS level can be adjusted based on the analog level. OTA gain values can be discarded and replaced by perceptual values. The adjustment can be perceptual in nature and not based on a DAC level such as a 16 bit DAC level. Calculation and adjustment can be performed quickly and accurately and adjustments can be made real time based on a level algorithm, such as, but not limited to, the AAA algorithm. Level alignment algorithms may always run in the background for analog and SPS, thereby allowing for application of adjustments real time. Application of the perceptual result can be calculated and applied at the initial switch of the command, before the listener hears any audio. In various embodiments, the calculation and application may be conducted in less than 743 ms.

In various embodiments, an approach to differences in loudness can include having volume adjuster/auto level control of each digital channel in a receiver of digital radio system. This approach can use the AAA feature as an underlying algorithm and can expand on the AAA feature. Such an approach can be implemented in the baseband, rather than a host processor as by the time the host processor can make the change time to audio would be delayed or changes applied after the audio has already started playing. The same perceived loudness can be implemented during each power up of the system. This approach can be expanded to the life cycle of the system, if there is some storage available to keep the value per relevant device model handy.

In some embodiments for the automotive industry, the value per relevant device model can be a value per relevant car model.

Consider the following examples of operation of a digital audio system. A first example is the operation of a current receiver without an AAA algorithm. In this first example, a user tunes to 100.1 and the user hears analog audio. After about 5.5 to 6.5 seconds, depending on signal conditions, the baseband will switch to digital audio. The analog audio and the digital audio may be time and level aligned, based on transmit (Tx) conditions.

A second example of a digital radio system includes receivers that include an AAA algorithm, but not an approach that uses the AAA feature as an underlying algorithm and expanding on the AAA feature to additional digital signals such as SPSs. In this second example, a user tunes to 100.1 and the user will hear analog audio. After about 6.5 to 20 seconds, depending on signal conditions and correlation thresholds, the baseband will switch to digital audio. The analog and digital audio will be time and level aligned, regardless of TX conditions.

A third example of a digital radio system includes receivers that include a AAA algorithm, but not an approach that uses the AAA feature as an underlying algorithm and expanding on the AAA feature to additional digital signals such as SPSs. In this third example, a user tunes to 100.1-2, which is an SPS, and the audio for the user to hear is muted. After about 5.5 seconds or so, the user will hear digital audio of the desired SPS. The loudness level can be statically calibrated to match MPS and SPS in ideal conditions. This value can be used as a default value. If the host switches to MPS at any time, the digital audio will play. This audio may or may not have the same level as the secondary program, SPS. Depending on the architecture of the system, there can be a time and level difference between the MPS and the analog signal, which will be apparent during the first blend. This can cause the user to adjust the volume once more. Receiver(s) with MPS correlation in the background can lessen the impact of this issue, since after about 20 seconds of SPS, the time and level correlation will most likely be found. In these first, second, and third examples, abrupt changes in the audio level regardless of station or content is not pleasing to the customer and has definite impact on the likeability/satisfaction with the technology.

FIG. 1 is an example of an embodiment of a transmit side of a digital radio system. The digital radio system can include a number of audio sources, audio source 102-1 and audio sources 102-2, 102-3 . . . 102-8. Audio source 102-1 is an audio source for analog and MPS, where the output of audio source 102-1 can be submitted to audio processing 104 that can operate on the analog and/or MPS. Alternatively, MPS may undergo separate processing at audio processing 106. A switch 101 or other selection mechanism may be used to couple audio source 102-1 to one of the two of audio processing 104 and audio processing 106. An MPS Tx gain value along with the audio processed MPS can be provided to MPS audio encoding 107 from audio processing 104. This input can be provided to MPS audio encoding 107 from audio processing 104 when audio processing is conducted at audio processing 104. The encoding can be conducted in real time. With respect to signal processing, by real time is meant completing some signal/data processing within a time that is sufficient to keep up with an external process, such as conducting MPS audio encoding as the corresponding analog signal is being processed. An analog signal from audio processing 104 can be submitted to analog modulation system 111.

Audio sources 102-2, 102-3 . . . 102-8 may be sources for SPS 1, SPS 2 . . . SPS 7, respectively, which are digital signals for transmission in addition to MPS. Audio sources 102-2, 102-3 . . . 102-7 can be disposed at different locations from each other and can have different audio processing to be applied. Output from audio source 102-2 can be input to audio processing 108-1 for SPS 1. The processed SPS 1 can be provided to SPS 1 audio encoding 109-1 along with a SPS 1 Tx gain value. Output from audio source 102-3 can be input to audio processing 108-2 for SPS 2. The processed SPS 2 can be provided to SPS 2 audio encoding 109-2 along with a SPS 2 Tx gain value. This structural architecture can be continued in parallel to the last of the audio sources and SPS signal. As shown in the example of FIG. 1, seven sources can be used for seven SPS signals. The number of sources and SPS signals may be more or less than seven. Output from audio source 102-8 can be input to audio processing 108-7 for SPS 7. The processed SPS 7 can be provided to SPS 7 audio encoding 109-7 along with a SPS 7 Tx gain value. The audio encoding for SPS 1, SPS 2 . . . SPS 7 can be conducted for real time operation or latent operation. The output provided by audio sources 102-2, 102-3 . . . 102-8, which may be at different locations, can be transmitted to a common location for audio processing and audio encoding. Alternatively, the outputs of SPS 1 audio encoding 109-1 . . . SPS 7 audio encoding 109-7 can be sent to a common location for further processing such as multiplexing.

Output from MPS audio encoding 107 and outputs from SPS 1 audio encoding 109-1, SPS 2 audio encoding 109-2 . . . SPS 7 audio encoding 109-7 can be multiplexed at digital stream multiplexing 112. The multiplexed stream from digital stream multiplexing 112 can be operated on at modulation 114. The output of modulation 114 can be combined with the output of analog modulation system 111 by a combiner 116. When audio processing 106 is used, the input to combiner 116 may be just the output of modulation 114. Output from combiner 116 can be provided to transmitter 118 for transmission.

For the SPS signals, if the analog signal is present, especially in hybrid transmission modes, then a reference signal for generating SPS Tx gain values is the analog signal. If an analog signal is not coming in, then the MPS stream can be the reference signal (especially in all-digital modes). In hybrid modes, where analog and digital have the same content in most cases, the AAA approach can be used and the reference audio level can come from analog or MPS stream. In the case of all-digital system, where the analog will have different or no content, the reference stream will be the MPS stream. The final Tx gain value of the outgoing audio, regardless of MPS and SPS, can be set to 0, if the level adjustment is performed within the baseband. If level adjustment is conducted by a host processor, the updated values of the Tx gain can be sent out. A perceptual level of the MPS and SPSs can be automatically adjusted based on an analog signal perceptual level. Audio for analog and MPS can come from the same source but may be subjected to different audio processing, thereby having different audio levels with Tx gain parameter being the adjustment in ideal cases. In some cases, this value may be incorrect, where perceptual detection of the level can be used and the subsequent adjustment of the digital MPS signal. MPS audio and analog audio are sent at the same time, while SPS can be recorded and encoded, as well as processed, at any time. There is no relationship between SPS and MPS in terms of level or content, except that the MPS and plurality of SPSs together in a digital radio broadcast signal may be constrained not to exceed a maximum bit rate for that particular transmission mode.

Figure 2A:
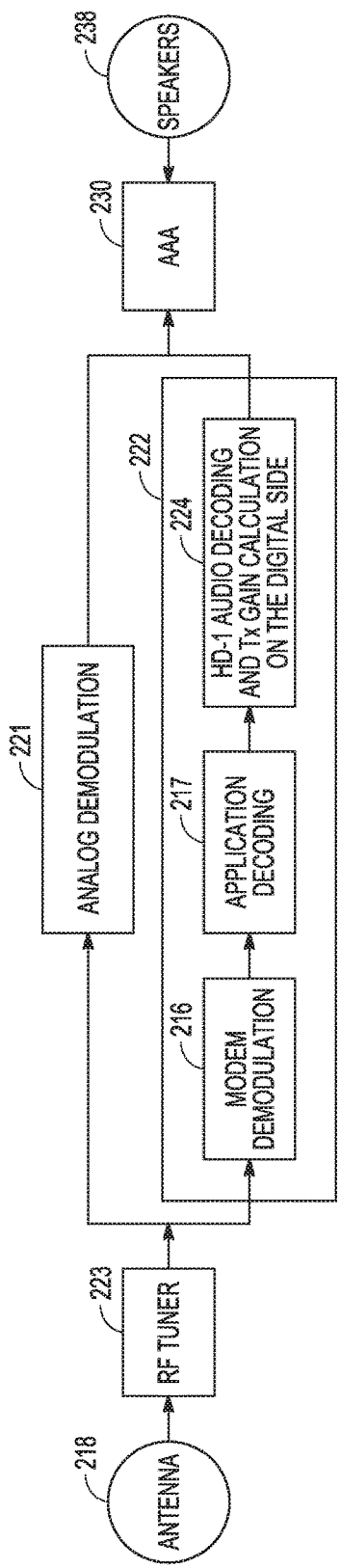
FIGS. 2A-2B illustrate an example of automatic time and level alignment on a main program service, in accordance with various embodiments.
Figure 2B:
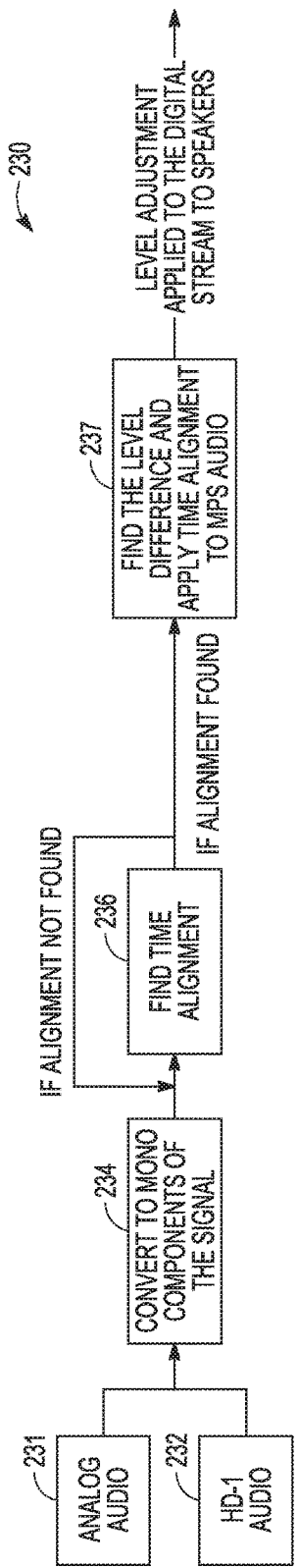

FIGS. 2A-2B illustrate an example of an embodiment of automatic time and level alignment on MPS. FIG. 2A shows components of a receiver of analog and digital signals with an AAA algorithm implemented to provide automatic time and level alignment prior to providing an audio signal to speakers 238. Signals received at antenna 218 can be directed to an RF tuner 223, whose output can be directed to analog demodulation 221 and to digital processing 222. Digital processing 222 can include modem demodulation 216, application decoding 217, and HD-1 audio decoding and Tx gain calculation 224 on the digital side. Output from the analog demodulation 221 and HD-1 audio decoding and Tx gain calculation 224 is subjected to an AAA processing 230 to time and level align the digital audio of the MPS to the analog audio. The output of the AAA processing 230 can be provided to speakers 238.

FIG. 2B shows signal flow in the AAA processing 230 for the MPS audio. Analog audio 231 from analog demodulation 221 and HD-1 audio 232 from HD-1 audio decoding and Tx gain calculation 224 can be converted to mono components of the signal at 234. From this conversion, finding a time alignment between digital and analog is performed at 236. If time alignment is not found, repeating the finding of time alignment between digital and analog at 236 is performed. If time alignment is found, then it needs to be applied to make sure that the blend is smooth, the difference in level between the digital audio of the MPS and the analog audio is found, at 237, and the time alignment is applied to the MPS audio. Once the level difference is found, level alignment can be applied to the digital stream, from which aligned time and level audio can be provided to speakers 238. Time alignment should be found for level alignment to function. If time alignment is not found, then level alignment should not be computed. After level alignment is found, Tx gain can be set to zero, if the level alignment is done on the receiver, else the updated value is sent to the host for adjustment.

In conventional approaches, the product of uncompressed audio and Tx Gain Value can be used to level audio to speakers for both MPS and SPS audio content. The Tx gain value range may be from −7 dB to +6 dB. In various embodiments, as taught herein, level of the MPS and SPS audio content can be adjusted based on analog signal perceptual level.

Figure 3:
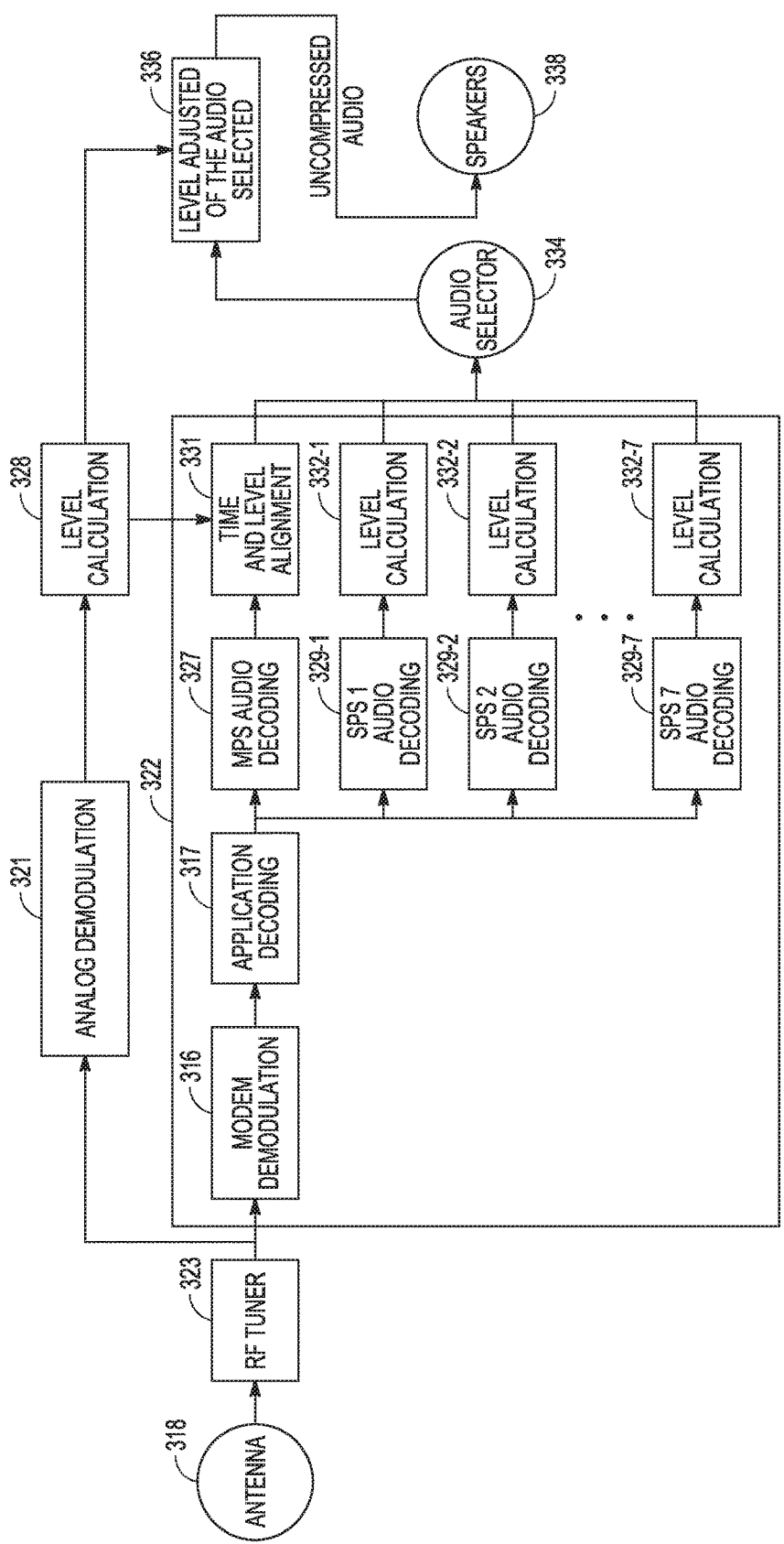
FIG. 3 is an example architecture for providing a selected digital audio signal to speakers from reception of a digital radio broadcast signal, in accordance with various embodiments.

FIG. 3 is an embodiment of an example architecture for providing a selected digital audio signal to speakers from reception of a digital radio broadcast signal. A digital radio broadcast signal received at antenna 318 is provided to RF tuner 323, whose output can be directed to analog demodulation 321 and to digital processing 322. The analog signal from analog demodulation 321 can be subjected to a calculation of the analog level at 328.

Digital processing 322 can include modem demodulation 316 and application decoding 317. With the digital signal including a MPS signal and a set of SPS signals, output from application decoding 317 can be provided to a set of audio decoders. The audio decoders can be arranged to operate in parallel with an audio decoder for each of the MPS signal and SPS signals in the received digital radio broadcast signal. In this example, the received digital radio broadcast signal included the MPS signal and seven SPS signals. The digital radio broadcast signal is not limited to having seven SPS signals, but may have more or less than seven SPS signals. The output from application decoding 317 can be provided to MPS audio decoding 327, whose output of audio content is subjected to time and level alignment 331, which can use input from analog level calculation at 328. The output from application decoding 317 can be provided to SPS 1 audio decoding 329-1, whose output of audio content is subjected to level calculation 332-1. The output from application decoding 317 can be provided to SPS 2 audio decoding 329-2, whose output of audio content is subjected to level calculation 332-2. The output from application decoding 317 can be provided to SPS 3 audio decoding 329-3, whose output of audio content is subjected to level calculation 332-3. This structural architecture can be continued in parallel to the last of the audio SPS signals to be decoded. The output from application decoding 317 can be provided to SPS 7 audio decoding 329-7, whose output is subjected to level calculation 332-7.

An audio selector 334 can select the audio from one of the MPS, SPS 1, SPS 2, SPS 3 . . . SPS 7 signals. This selection may be implemented after level calculation. Audio selector 334 from an input from a user interface can be used to select one of the audio content of the MPS, SPS 1, SPS 2, SPS 3 . . . SPS 7 to be played by speakers 338. Alternatively, audio selector 334 can have an input to determine which of the audio content of the MPS, SPS 1, SPS 2, SPS 3 . . . SPS 7 provides the best audio content based on a set of criteria and select the audio content based on the determination to be played by speakers 338. At 336, the level of the digital audio selected using audio selector 334 is adjusted. Such adjustment can be made based on a reference signal. If the analog signal is present, then the reference signal is the analog signal using an input from analog level calculation at 328. If the analog signal is not coming in, then the MPS stream can be the reference signal. After level adjustment of the selected digital audio content, audio from the selected, level adjusted digital audio content can be directed to speakers 338 as uncompressed audio.

The final Tx gain value of the outgoing audio to speakers 338, regardless of MPS or SPS, can be set to 0, if the level adjustment is performed within the baseband. If the level adjustment is performed on the host, the updated values of the Tx gain can be sent out. With the analog signal present, perceptual level of the audio of the MPS, SPS 1, SPS 2, SPS 3 . . . SPS 7 an be automatically adjusted based on the analog signal perceptual level. A resource constraint device can be used to determine the perceptual level of the analog signal and adjust the audio of the digital SPS 1, SPS 2, SPS 3, . . . , SPS 7, or MPS before the audio plays out from speakers 338.

Functionalities with respect to FIG. 3 and other figures can be implemented in hardware or a combination of hardware and stored instructions executable by one or more processes. For example, but not limited to this example, modulation, demodulation, encoding, and decoding may be implemented with electronic circuitry in combination with executable instructions as taught herein.

Figure 4:
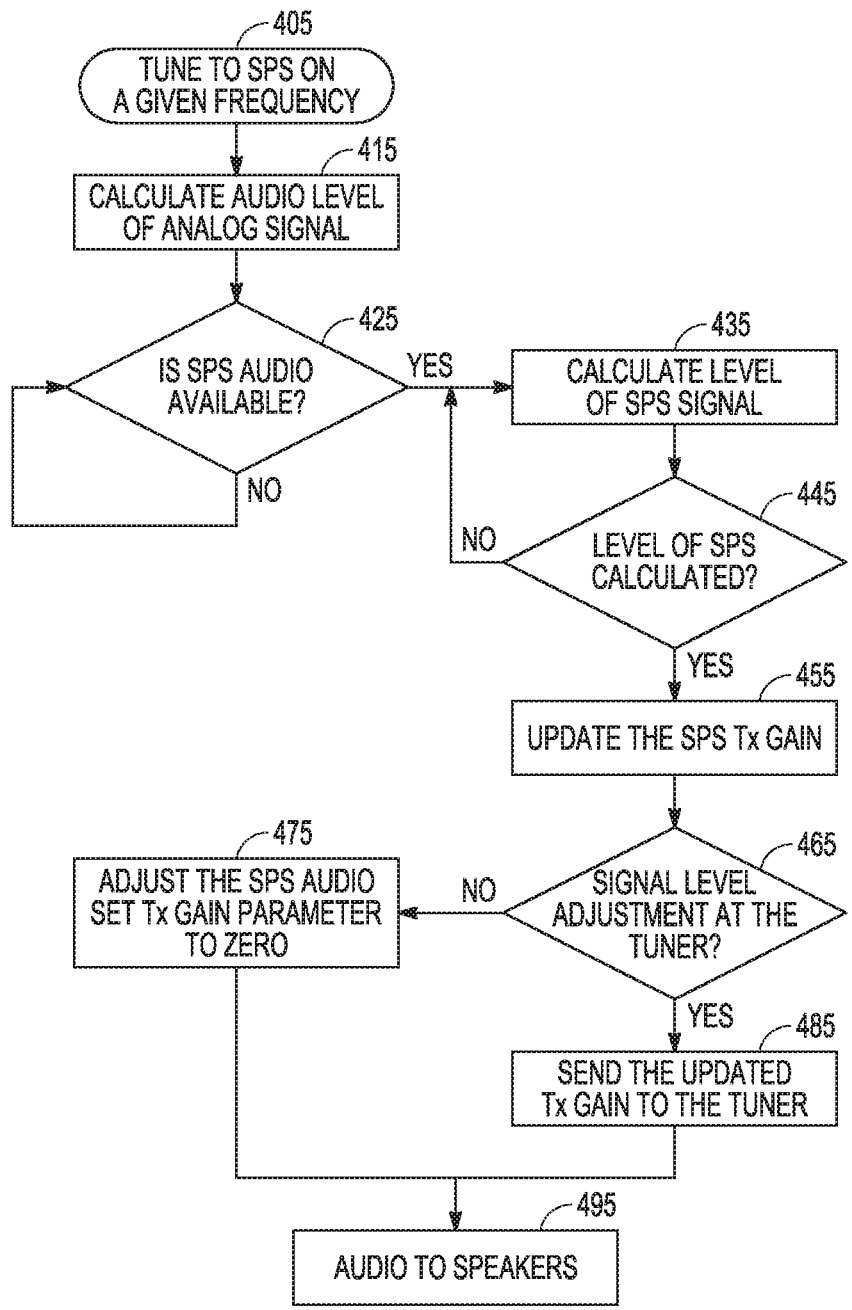
FIG. 4 is a flow diagram of features of an example method that initially tunes to a supplemental program service of a digital radio broadcast signal on a new frequency or existing frequency, in accordance with various embodiments.

FIG. 4 is a flow diagram of features of an embodiment of an example method that initially tunes to a SPS of a digital radio broadcast signal on a new frequency or existing frequency. At 405, a receiver is tuned to a SPS on a given frequency. At 415, audio level of a corresponding analog signal is calculated. At 425, a determination is made as to whether the audio of the SPS is available (digital audio is available and has passed a certain quality level). If the audio of the SPS is not available, the process waits and repeats the query of the availability of the audio of the SPS to which the receiver is tuned. At 435, the level of the audio of the SPS signal is calculated. A coarse detection at a minimum may be performed in less than one second at least a minimum of 18 audio frames. At 445, a determination is made as to whether the level of the audio of the SPS is calculated. If the level of the audio of the SPS has not been calculated, the process waits and repeats the input to calculate the level of the audio of the SPS to which the receiver is tuned.

At 455, the Tx gain of the SPS to which the receiver is tuned is updated. Updating the SPS Tx gain value can be based on differences of the audio level of the SPS and the audio level of reference signal. The audio level of the reference signal can be the audio level of the analog signal calculated at 415. At 465, a determination can be made as to whether a level adjustment of the audio SPS signal is to be made at a tuner for the receiver. At 475, if a level adjustment of the audio SPS signal is not to be made at the tuner, the level of the SPS audio can be adjusted with the updated Tx gain value, and then audio is provided to the speakers at 495, the Tx gain value to the host is set to 0. If there is a recovery from an outage, the last calculated value can be used to speed up the availability of the digital audio. At 485, if a level adjustment of the audio SPS signal is to be made at the tuner, the updated Tx gain value can be sent to the tuner by which audio is provided to the speakers at 495.

Figure 5:
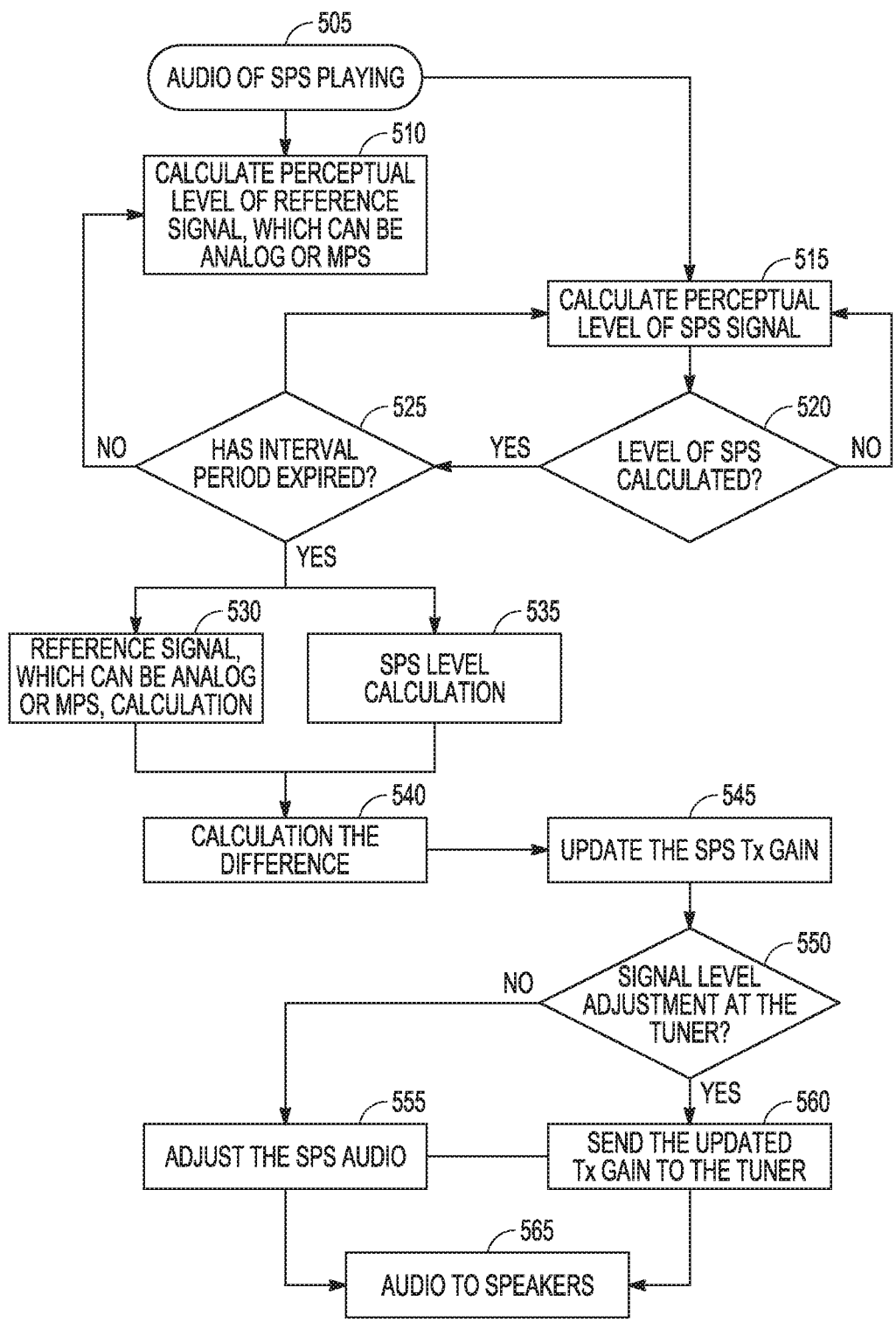
FIG. 5 is a flow diagram of features of an example method of steady state operation of a digital audio signal, in accordance with various embodiments.

FIG. 5 is a flow diagram of features of an embodiment of an example method of steady state operation of a digital audio signal. At 505, audio of an SPS signal is playing. At 510, a perceptual level of a reference signal, which can be analog or MPS, is calculated, where the reference signal has a correspondence to the SPS signal playing. The perceptual level of the analog signal can be calculated using a long-term average. Such calculation may be realized within the range of 3-5 seconds, but can vary based on the methodology of the calculation. The long-term average can be used as the signal is not aligned and the content can be different. If the user switches the relative loudness should be the same. At 515, a perceptual level of the audio of the SPS signal is calculated. Perceptual levels of the audio of other SPS signals in the digital radio broadcast signal containing the SPS signal, whose audio is playing, can be calculated. The various level calculations can be perceptual in nature, but depending on central processing unit (CPU) resources, other methods can be used. At 520, a determination is made as to whether the level of the audio of the SPS has been calculated. If the level of the audio of the SPS has not been calculated, the process waits and generates an input to calculate the level of the audio of the SPS at 515. At 525, a determination is made as to whether the interval period has been reached. The interval period should be large, such as for example 3-5 seconds, but can be longer, as a change made to the playing audio of the SPS should have minimal impact to the listener. If the interval period has not been reached, an input can be generated to calculate the level of the audio of the SPS at 515, where the process can proceed back to a determination as to whether the interval period has expired after the level of the audio of the SPS is calculated at 515.

From 525, after the interval period has expired, the level of the reference signal, which can be analog or MPS, can be calculated at 530 and the level of the audio of the SPS can be calculated at 535. The various level calculations can be perceptual in nature, but depending on CPU resources, other methods can be used. At 540, the difference between the level of the audio of the analog signal and the level of the audio of the SPS signal is calculated. Differences between the level of the audio of the analog signal and the level of the audio of other SPS signals in the digital radio broadcast signal containing the SPS signal whose audio is playing can be calculated. At 545, the Tx gain of the SPS, of which the audio is playing, is updated. Updating the SPS Tx gain value can be based on differences of the audio level of the SPS and the audio level of reference signal. The audio level of the reference signal can be the audio level of the analog signal calculated at 530. The Tx gain may be optionally updated by 1 dB at the maximum with adjustment made in the interval period.

At 550, a determination can be made as to whether a level adjustment of the audio SPS signal is to be made at a tuner for the receiver. At 555, if a level adjustment of the audio SPS signal is not to be made at the tuner, the level of the SPS audio can be adjusted with the updated Tx gain value and then audio is provided to the speakers at 565. At this point the Tx gain value to the host is set to 0. At 560, if a level adjustment of the audio SPS signal is to be made at the tuner, the updated Tx gain value can be sent to the tuner by which audio is provided to the speakers at 565. With the other SPS signals in the digital radio broadcast signal containing the SPS signal, whose audio is playing, also processed with this SPS, switch to audio of another SPS may be accomplished in a short time period such that a user may not experience a perceptual change in audio level.

Figure 6:
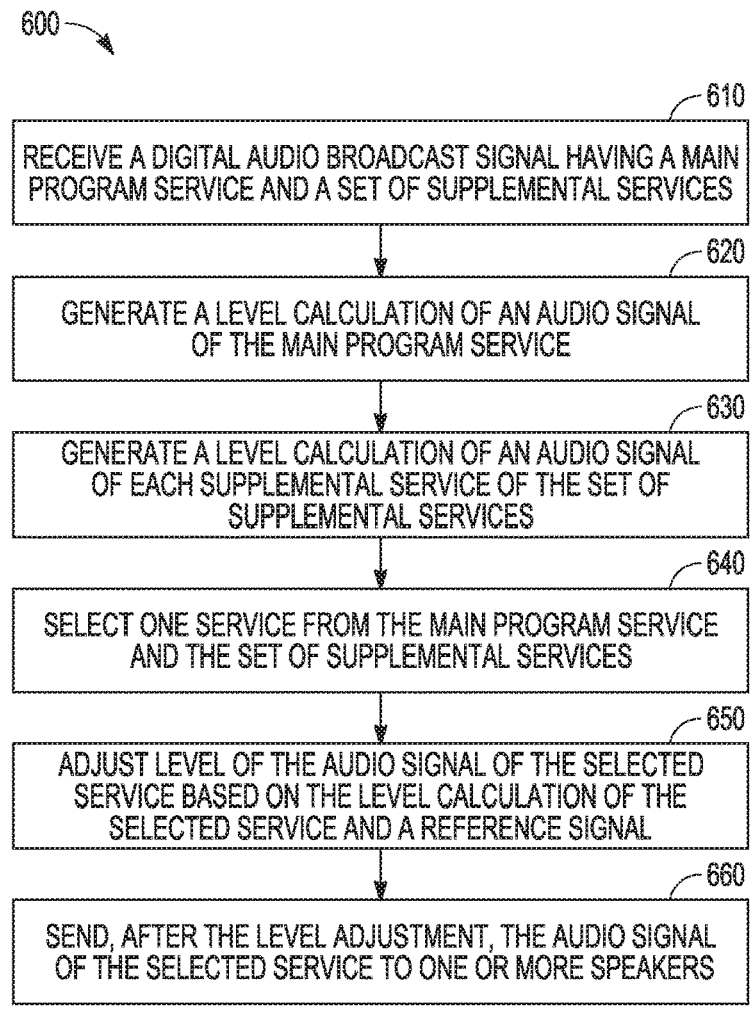
FIG. 6 is a flow diagram of features of an example method of processing a digital audio broadcast signal, in accordance with various embodiments.

FIG. 6 is a flow diagram of features of an embodiment of an example method 600 of processing a digital audio broadcast signal. At 610, a digital audio broadcast signal having a main program service and a set of supplemental program services is received. At 620, a level calculation of an audio signal of the main program service is generated. At 630, a level calculation of an audio signal of each supplemental program service of the set of supplemental program services is generated. The level of the audio signal of the main program service and the level of the audio signal of each supplemental program service can be calculated by a number of different techniques. Generating the level calculation of the audio signal of the main program service and generating the level calculation of the audio signal of each supplemental program service can include making measurements in accordance with the International Telecommunications Union Recommendation (ITU-R) BS.1770 specification, entitled "Algorithms to measure audio programme loudness and true-peak audio level."

At 640, one service from the main program service and the set of supplemental program services is selected. At 650, level of the audio signal of the selected service is adjusted based on the level calculation of the selected service and a reference signal. The reference signal can be an analog audio signal in the digital audio broadcast signal. The reference signal can be the audio signal of the main program service. Use of the main program service can be implemented if an analog signal is not present in the digital audio broadcast signal. Adjusting level of the audio signal of the selected service can include using an updated transmit gain value to adjust the level, the transmit gain value carried in the received digital audio broadcast signal. The updated transmit gain can be generated using a difference in value between the level calculation of the selected service and a determined level of audio of the reference signal. At 660, after the level adjustment, the audio signal of the selected service is sent to one or more speakers. In various embodiments, from a command to switch to the audio signal of the selected service, the audio signal can be sent to the set of speakers before a listener hears any acoustic signal from the one or more speakers originating from audio content in the digital audio broadcast signal.

Variations of method 600 or methods similar to method 600 can include a number of different embodiments that may be combined depending on the application of such methods and/or the architecture of systems in which such methods are implemented. Such methods can include receiving the digital audio broadcast signal to include receiving a digital audio broadcast signal having an analog audio signal in addition to the main program service and the set of supplemental program services; and generating the level calculation of the audio signal of the main program service to include performing a time and level alignment of the audio signal of the main program service with the analog audio signal. The analog audio signal can be implemented as the reference signal level in the adjustment of the audio signal of the selected service based on the level calculation of the selected service and a reference signal. Adjusting level of the audio signal of the selected service based on the level calculation of the selected service and the reference signal can include determining a difference in value between the level calculation of the selected service and a level of the analog audio signal.

Variations of method 600 or methods similar to method 600 can include selecting the one service to include tuning to one supplemental program service of the set of supplemental program services on a given frequency prior to generating the level calculation of the audio signal of the selected one supplemental program service; and generating the level calculation of the audio signal of the selected one supplemental program service in less than a minute.

In various embodiments, a non-transitory machine-readable storage device can comprise instructions stored thereon, which, when executed by a processor of a digital audio system, cause the digital audio system to perform operations, the operations comprising one or more features similar to or identical to features of methods and techniques described with respect to method 600, variations thereof, and/or features of other methods taught herein. The physical structures of such instructions may be operated on by one or more processors. Executing these physical structures can cause the machine to perform operations comprising operations to: generate a level calculation of an audio signal of a main program service contained in a received digital audio broadcast signal, the received digital audio broadcast having a main program service and a set of supplemental program services in addition to the main program service; generate a level calculation of an audio signal of each supplemental program service of the set of supplemental program services; select one service from the main program service and the set of supplemental program services; adjust level of the audio signal of the selected service based on the level calculation of the selected service and a reference signal; and send, after the level adjustment, the audio signal of the selected service to one or more speakers. The reference signal can be the analog audio signal or the reference signal can be the audio signal of the main program service.

In variations of the machine-readable storage devices, instructions can include instructions to perform operations with respect the received digital audio broadcast signal having an analog audio signal in addition to the main program service and the set of supplemental program services; and the generation of the level calculation of the audio signal of the main program service can include performance of a time and level alignment of the audio signal of the main program service with the analog audio signal. The analog audio signal can be a reference signal and adjustment of the level of the audio signal of the selected service based on the level calculation of the selected service and the reference signal can include determination of a difference in value between the level calculation of the selected service and a level of the analog audio signal.

In variations of the machine-readable storage devices, instructions can include instructions to perform operations in which adjustment of the level of the audio signal of the selected service can include use of an updated transmit gain value to adjust the level, the transmit gain value carried in the received digital audio broadcast signal. The updated transmit gain can be generated using a difference in value between the level calculation of the selected service and a determined level of audio of the reference signal. Such variations can include selection of the one service to include a tuning to one supplemental program service of the set of supplemental program services on a given frequency prior to generation of the level calculation of the audio signal of the selected one supplemental program service; and generation of the level calculation of the audio signal of the selected one supplemental program service can be conducted in less than a minute. Such variations can include generation of the level calculation of the audio signal of the main program service and generation of the level calculation of the audio signal of each supplemental program service to include performance of measurements in accordance with the International Telecommunications Union Recommendation (ITU-R) BS.1770 specification.

Figure 7:
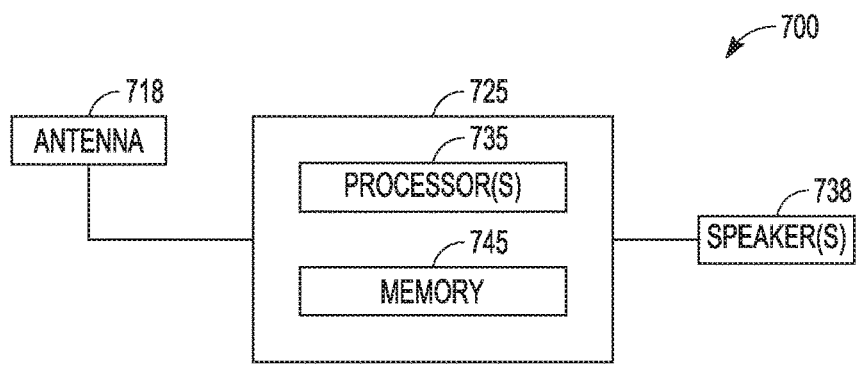
FIG. 7 is a block diagram of an example digital audio system arranged to operate with respect to providing an audio signal to a speaker from digital audio content in a received digital audio broadcast signal, in accordance with various embodiments.

FIG. 7 is a block diagram of an embodiment of an example digital audio system 700 arranged to operate with respect to providing an audio signal to a speaker from digital audio content in a received digital audio broadcast signal according to techniques as taught herein. Digital audio system 700 can include an antenna 718 to receive the digital radio broadcast signal, where the digital audio broadcast signal can have a main program service and a set of supplemental program services. Digital audio system 700 can include one or more speakers 738 to output an acoustic signal from an audio signal carried in the digital radio broadcast signal. Digital audio system 700 can include processing circuit 725 operatively coupled to antenna 718.

Processing circuit 725 can be configured to: generate a level calculation of an audio signal of the main program service; generate a level calculation of an audio signal of each supplemental program service of the set of supplemental program services; select one service from the main program service and the set of supplemental program services; adjust level of the audio signal of the selected service based on the level calculation of the selected service and a reference signal; and send, after the level adjustment, the audio signal of the selected service to the one or more speakers. The reference signal can be the analog audio signal or the reference signal can be the audio signal of the main program service. Processing circuit 725 can include one or more processors 735 and memory 745 having instructions to do conduct functions of processing circuit 725 as taught herein. The one or more processors 735 can include a baseband processor. Processing circuit 725 can include hardware and software to perform functionalities as taught herein, for example, but not limited to, functionalities and structures associated with FIGS. 2-6.

The received digital audio broadcast signal can have an analog audio signal in addition to the main program service and the set of supplemental program services. The generation of the level calculation of the audio signal of the main program service can include performance of a time and level alignment of the audio signal of the main program service with the analog audio signal. Generation of the level calculation of the audio signal of the main program service and generation of the level calculation of the audio signal of each supplemental program service can include measurements of a perceptual level of the audio signal of the main program service and perceptual levels of the audio signals of the supplemental program services of the set of supplemental program services. Adjustment of the level of the audio signal of the selected service can include determination of a difference in value between the level calculation of the selected service and a level of the analog audio signal. Adjustment of the level of the audio signal of the selected service can include use of an updated transmit gain value to adjust the level, the transmit gain value carried in the received digital audio broadcast signal.

Each patent and publication referenced or mentioned herein is hereby incorporated by reference to the same extent as if it had been incorporated by reference in its entirety individually or set forth herein in its entirety. Any conflicts of these patents or publications with the teachings herein are controlled by the teaching herein. Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A method of processing a digital audio broadcast signal, the method comprising:
   receiving a digital audio broadcast signal having a main program service and a set of supplemental program services;
   generating a level calculation of an audio signal of the main program service;
   generating a level calculation of an audio signal of each supplemental program service of the set of supplemental program services;
   selecting one service from the main program service and the set of supplemental program services;
   adjusting level of the audio signal of the selected service based on the level calculation of the selected service and a reference signal; and
   sending, after the level adjustment, the audio signal of the selected service to one or more speakers.

2. The method of claim 1, wherein
   receiving the digital audio broadcast signal includes receiving a digital audio broadcast signal having an analog audio signal in addition to the main program service and the set of supplemental program services; and
   generating the level calculation of the audio signal of the main program service includes performing a time and level alignment of the audio signal of the main program service with the analog audio signal.

3. The method of claim 2, wherein the reference signal is the analog audio signal.

4. The method of claim 3, adjusting level of the audio signal of the selected service based on the level calculation of the selected service and the reference signal includes determining a difference in value between the level calculation of the selected service and a level of the analog audio signal.

5. The method of claim 1, wherein the reference signal is the audio signal of the main program service.

6. The method of claim 1, wherein adjusting level of the audio signal of the selected service includes using an updated transmit gain value to adjust the level, the transmit gain value carried in the received digital audio broadcast signal.

7. The method of claim 6, wherein the updated transmit gain is generated using a difference in value between the level calculation of the selected service and a determined level of audio of the reference signal.

8. The method of claim 1, wherein
   selecting the one service includes tuning to one supplemental program service of the set of supplemental program services on a given frequency prior to generating the level calculation of the audio signal of the selected one supplemental program service; and
   generating the level calculation of the audio signal of the selected one supplemental program service in less than a minute.

9. The method of claim 1, wherein generating the level calculation of the audio signal of the main program service and generating the level calculation of the audio signal of each supplemental program service includes making measurements in accordance with the International Telecommunications Union Recommendation (ITU-R) BS.1770 specification.

10. A digital audio system comprising:
   an antenna to receive a digital radio broadcast signal, the digital audio broadcast signal having a main program service and a set of supplemental program services;
   one or more speakers to output an acoustic signal from an audio signal carried in the digital radio broadcast signal; and
   a processing circuit operatively coupled to the antenna, the processing circuit configured to:
      generate a level calculation of an audio signal of the main program service;
      generate a level calculation of an audio signal of each supplemental program service of the set of supplemental program services;
      select one service from the main program service and the set of supplemental program services;
      adjust level of the audio signal of the selected service based on the level calculation of the selected service and a reference signal; and
      send, after the level adjustment, the audio signal of the selected service to the one or more speakers.

11. The digital audio system of claim 10, wherein
   the received digital audio broadcast signal has an analog audio signal in addition to the main program service and the set of supplemental program services; and
   the generation of the level calculation of the audio signal of the main program service includes performance of a time and level alignment of the audio signal of the main program service with the analog audio signal.

12. The digital audio system of claim 11, wherein the reference signal is the analog audio signal.

13. The digital audio system of claim 12, adjustment of the level of the audio signal of the selected service includes determination of a difference in value between the level calculation of the selected service and a level of the analog audio signal.

14. The digital audio system of claim 10, wherein the reference signal is the audio signal of the main program service.

15. The digital audio system of claim 10, wherein adjustment of the level of the audio signal of the selected service includes use of an updated transmit gain value to adjust the level, the transmit gain value carried in the received digital audio broadcast signal.

16. The digital audio system of claim 10, wherein generation of the level calculation of the audio signal of the main program service and generation of the level calculation of the audio signal of each supplemental program service includes measurements of a perceptual level of the audio signal of the main program service and perceptual levels of the audio signals of the supplemental program services of the set of supplemental program services.

17. A non-transitory machine-readable storage device having instructions stored thereon, which, when executed by a processor of a digital audio system, cause the digital audio system to perform operations, the operations comprising operations to:

generate a level calculation of an audio signal of a main program service contained in a received digital audio broadcast signal, the received digital audio broadcast having a main program service and a set of supplemental program services in addition to the main program service;

generate a level calculation of an audio signal of each supplemental program service of the set of supplemental program services;

select one service from the main program service and the set of supplemental program services;

adjust level of the audio signal of the selected service based on the level calculation of the selected service and a reference signal; and send, after the level adjustment, the audio signal of the selected service to one or more speakers.

18. The non-transitory machine-readable storage device of claim 17, wherein the received digital audio broadcast signal has an analog audio signal in addition to the main program service and the set of supplemental program services; and the generation of the level calculation of the audio signal of the main program service includes performance of a time and level alignment of the audio signal of the main program service with the analog audio signal.

19. The non-transitory machine-readable storage device of claim 17, wherein the reference signal is the analog audio signal or the reference signal is the audio signal of the main program service.

20. The non-transitory machine-readable storage device of claim 17, wherein adjustment of the level of the audio signal of the selected service includes use of an updated transmit gain value to adjust the level, the transmit gain value carried in the received digital audio broadcast signal.

* * * * *